(12) United States Patent
Stauss et al.

(10) Patent No.: US 9,184,337 B2
(45) Date of Patent: *Nov. 10, 2015

(54) METHOD FOR PRODUCING A LIGHT-EMITTING DIODE

(71) Applicant: OSRAM Opto Semiconductors GmbH, Regensburg (DE)

(72) Inventors: Peter Stauss, Regensburg (DE); Philipp Drechsel, Mintraching (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/335,691

(22) Filed: Jul. 18, 2014

(65) Prior Publication Data

US 2014/0329350 A1 Nov. 6, 2014

Related U.S. Application Data

(63) Continuation of application No. 13/499,232, filed as application No. PCT/EP2010/064353 on Sep. 28, 2010, now Pat. No. 8,828,768.

(30) Foreign Application Priority Data

Sep. 30, 2009 (DE) .......................... 10 2009 047 881

(51) Int. Cl.
*H01L 21/02* (2006.01)
*H01L 33/00* (2010.01)

(52) U.S. Cl.
CPC .......... *H01L 33/007* (2013.01); *H01L 21/0254* (2013.01); *H01L 21/02381* (2013.01); *H01L 21/02458* (2013.01); *H01L 21/02507* (2013.01); *H01L 21/02639* (2013.01)

(58) Field of Classification Search
CPC .................... H01L 21/02458; H01L 21/0254; H01L 33/007
See application file for complete search history.

(56) References Cited

U.S. PATENT DOCUMENTS 6,325,850 B1 12/2001 Beaumont et al.
6,611,002 B2 8/2003 Weeks et al.
(Continued)

FOREIGN PATENT DOCUMENTS

CN 101427391 A 5/2009
DE 10151092 A1 5/2003
(Continued)

OTHER PUBLICATIONS

Krost, A., "Simultaneous measurement of wafer curvature and true temperature during metalorganic growth of group-III nitrides on silicon and sapphire," Physica Status Solidi (b), vol. 242, No. 13, Nov. 2005, pp. 2570-2574.
(Continued)

*Primary Examiner* — John C Ingham
(74) *Attorney, Agent, or Firm* — Slater & Matsil, L.L.P.

(57) ABSTRACT

A method is provided for producing a light-emitting diode. In one embodiment, a series of layers is deposited on the silicon surface of a carrier in a direction of growth and a light-emitting diode structure is deposited on the series of layers. The series of layers includes a GaN layer, which is formed with gallium nitride. The series of layers includes a masking layer, which is formed with silicon nitride. The masking layer follows at least part of the GaN layer in the direction of growth.

21 Claims, 4 Drawing Sheets

(56) References Cited

U.S. PATENT DOCUMENTS

| | | |
|---|---|---|
| 6,617,060 B2 | 9/2003 | Weeks, Jr. et al. |
| 6,818,061 B2 | 11/2004 | Peczalski et al. |
| 8,334,155 B2 | 12/2012 | Krames et al. |
| 8,362,503 B2 | 1/2013 | Saxler et al. |
| 8,828,768 B2 * | 9/2014 | Stauβ et al. .................. 438/47 |
| 2007/0197004 A1 | 8/2007 | Dadgar et al. |
| 2008/0220555 A1 | 9/2008 | Saxler et al. |
| 2010/0133658 A1 | 6/2010 | Dadgar et al. |

FOREIGN PATENT DOCUMENTS

| | | |
|---|---|---|
| DE | 102006008929 A1 | 8/2007 |
| DE | 102007020979 A1 | 10/2008 |
| JP | 2001148348 A | 5/2001 |
| JP | 2009527913 A | 7/2009 |
| WO | 2007096405 A1 | 8/2007 |
| WO | 2007123496 A1 | 11/2007 |
| WO | 2008042020 A2 | 4/2008 |
| WO | 2008132204 A2 | 11/2008 |
| WO | 2009002365 A1 | 12/2008 |

OTHER PUBLICATIONS

Reiher, A., "Efficient stress relief in GaN heteroepitaxy on Si(111) using low-temperature AlN interlayers," Journal of Crystal Growth, No. 248, 2003, pp. 563-567.

* cited by examiner

METHOD FOR PRODUCING A LIGHT-EMITTING DIODE

This is a continuation application of U.S. application Ser. No. 13/499,232, entitled "Method for Producing a Light-Emitting Diode" which was filed on May 11, 2012 and is a national phase filing under section 371 of PCT/EP2010/064353, filed Sep. 28, 2010, which claims the priority of German patent application 10 2009 047 881.7, filed Sep. 30, 2009, all of which is incorporated herein by reference in its entirety.

TECHNICAL FIELD

A method for producing a light-emitting diode is specified.

BACKGROUND

The documents WO 2007/096405 (U.S. counterpart application publication 2007/0197004) and U.S. Pat. No. 6,611,002 describe epitaxially depositing gallium nitride-based layers on a silicon substrate.

SUMMARY OF THE INVENTION

In one aspect, the present invention specifies a method by which gallium nitride-based layers having a high layer thickness and high material quality can be deposited on a silicon surface.

In accordance with at least one embodiment of the method for producing a light-emitting diode, one method step involves providing a carrier substrate having a silicon surface. For this purpose, the carrier substrate can comprise silicon, for example. Furthermore, it is possible for the carrier substrate to be an SOI substrate (Silicon-On-Insulator Substrate). The silicon surface of the carrier substrate is a (111) silicon surface, for example.

The carrier substrate is distinguished, for example, by its good thermal conductivity of at least 130 W/(mK).

In accordance with at least one embodiment of the method, one method step involves depositing a layer sequence on the silicon surface. By way of example, the layer sequence is applied epitaxially to the silicon surface. The layer sequence has a growth direction in which it is grown onto the silicon surface. By way of example, the growth direction is perpendicular to the silicon surface or forms a small angle of <7°, for example, with the perpendicular to the silicon surface.

In accordance with at least one embodiment of the method, one method step involves depositing a light-emitting diode structure onto the layer sequence, that is to say that, for example, the following sequence arises in the growth direction: silicon surface, layer sequence, light-emitting diode structure. The light-emitting diode structure is based on gallium nitride, for example. The layer sequence serves, for example, to enable growth of the light-emitting diode structure with relatively high layer thicknesses of at least 3 μm, for example, at least 5 μm, and a high material quality on the silicon surface.

In accordance with at least one embodiment of the method, the layer sequence contains a GaN layer formed with gallium nitride. By way of example, the GaN layer consists of an n-doped gallium nitride.

In this embodiment, the layer sequence furthermore contains a masking layer formed with silicon nitride and, for example, consisting of silicon nitride. The growth of the masking layer can take place, for example, by the simultaneous introduction of a silicon precursor such as, for example, silane or disilane or an organic silicon compound comprising a nitrogen precursor such as ammonia or dimethylhydrazine into the growth chamber in which the epitaxial growth, for example, is effected. On the growth surface, the two precursors then react to form silicon nitride.

In this case, the masking layer can be embodied and produced as specified in the document WO 2007/096405 and U.S. equivalent patent publication 2007/0197004. With regard to the embodiment and production of the masking layer described therein, the document WO 2007/096405 is hereby expressly incorporated by reference.

In this case, the masking layer succeeds at least part of the GaN layer in the growth direction. That is to say that, in accordance with this embodiment of the method, the masking layer is deposited after the first growth of a GaN layer in the growth direction. In this case, the masking layer can directly adjoin a GaN layer. In this case, "at least part of the GaN layer" means that the masking layer can also be arranged in the GaN layer. That is to say that part of the GaN layer is deposited, then followed by the masking layer and then followed by the rest of the GaN layer.

In this case, it has been found that applying the masking layer at the earliest after the deposition of a first GaN layer is advantageous for improving the material quality of a subsequent light-emitting diode structure. By contrast, introducing a masking layer before the deposition of a first GaN layer appears to suppress the build-up of a compressive strain in the layer sequence, which leads to an impairment of the material quality of the light-emitting diode structure.

Overall, a method with late introduction of the masking layer in the layer sequence, enables a light-emitting diode structure to be subsequently applied to the layer sequence and to have particularly high material quality in conjunction with relatively high layer thickness. The improvement in the material quality in the light-emitting diode structure can be explained, for example, by the fact that the build-up of a compressive strain in the layer sequence is positively influenced by the late introduction of the masking layer in the layer sequence.

In accordance with at least one embodiment of the method, the masking layer is arranged within a GaN layer. In other words, the masking layer in this embodiment directly adjoins a GaN layer both in the growth direction and counter to the growth direction. The GaN layer is then preferably the last GaN layer in the growth direction that is deposited before the growth of the light-emitting diode structure.

In accordance with at least one embodiment of the method, at least two GaN layers are arranged upstream of the masking layer in the growth direction. That is to say that the masking layer is deposited, for example, in the third GaN layer of the layer stack. This proves to be advantageous since the masking layer in this way is deposited relatively late in the layer stack and thus cannot adversely influence the build-up of a compressive strain.

In accordance with at least one embodiment of the method, the masking layer is an incompletely closed layer. Windows are then formed in the masking layer, in which windows the GaN layer adjoined by the masking layer on both sides is not perforated by the masking layer.

In accordance with at least one embodiment of the method, the layer sequence contains at least two GaN layers. Each of the GaN layers is succeeded by an AlN layer and/or an AlGaN layer in the growth direction. This is the case in particular also for the last GaN layer in the growth direction in the layer stack, such that the light-emitting diode structure can, for example, directly succeed the last AlN layer or the last AlGaN layer in the layer stack.

If an AlGaN layer is used, then it preferably has a small Ga proportion of between, for example, at least 5% and at most 10%.

In accordance with at least one embodiment of the method, the layer sequence contains at least two GaN layers and a masking layer is arranged within each GaN layer of the at least two GaN layers. By way of example, a masking layer can then be arranged within each GaN layer of the layer sequence.

The masking layer is a masking layer as described further above. The masking layer within the GaN layer therefore adjoins a GaN (partial) layer in each case in the growth direction and counter to the growth direction. The introduction of a masking layer into at least two or into each GaN layer of the layer sequence influences the build-up of a compressive strain in the layer sequence particularly positively.

In accordance with at least one embodiment of the method, the layer sequence between the silicon surface and the first succeeding masking layer as seen in the growth direction of the layer sequence from the silicon surface is free of an AlGaN layer. In other words, the layer sequence contains no AlGaN transition layer at least in the region before the occurrence of the first masking layer.

Contrary to the view represented in the document U.S. Pat. No. 6,617,060 B1, for example, it has been found that an AlGaN transition layer can be dispensed with at least in places in the layer stack. The AlGaN layer is provided, in particular, for reducing the strains which arise as a result of the different coefficients of thermal expansion between the carrier substrate, in particular the silicon surface, and the grown GaN layers and which build up during the cooling of the layer sequence. It is to be expected, however, that many further matching dislocations form as a result of the effective contraction of the GaN layers relative to the silicon surface during the cooling of the layer sequence. Therefore, dispensing with the AlGaN layer can prove to be advantageous.

In accordance with at least one embodiment, the layer sequence overall is free of an AlGaN layer. That is to say that, in this embodiment, no AlGaN transition layer is arranged in the entire layer sequence.

In accordance with at least one embodiment of the method, a GaN layer directly succeeds the buffer layer, arranged on the silicon surface, in the growth direction, wherein the GaN layer is, in particular, a pseudomorphic GaN layer. The pseudomorphic GaN layer is distinguished, inter alia, by the fact that it realizes an inverse strain with respect to the underlying layers. During the cooling of the layer sequence, the pseudomorphic GaN layer can therefore counteract a contraction of the overlying further GaN layers relative to the silicon surface.

In this case, a pseudomorphic GaN layer is understood to be, in particular, a GaN layer grown with maintenance of the crystal structure of the silicon surface. In this case, it is also possible, in particular, for the lattice constant of the silicon surface to be transferred to the pseudomorphic GaN layer.

In accordance with at least one embodiment of the method, in the growth direction a first masking layer is arranged between the pseudomorphic GaN layer and a further GaN layer. The masking layer can, for example, directly adjoin the two GaN layers, that is to say that it is arranged within a GaN layer, wherein that part of the GaN layer which lies below the masking layer in the growth direction is pseudomorphic and that part of the GaN layer which lies above the masking layer in the growth direction is non-pseudomorphic.

In this case, it has been found that introducing a pseudomorphic GaN layer in conjunction with an advantageously embodied masking layer, which is preferably an SiN masking layer, has the effect that the subsequent GaN layer grows anew on the pseudomorphic GaN layer partly covered by the masking layer and, in this case, dislocations which can originate from the underlying layers or arise there can be effectively blocked.

Preferably, the masking layer in this case has a thickness of between at least 0.5 nm and at most 2.5 nm, in particular in the range of between at least 1 nm and at most 2 nm. In this case, the masking layer is preferably embodied as a non-closed layer, as described above. The masking layer has windows, for example, and covers the underlying pseudomorphic GaN layer in the manner of a net.

In accordance with at least one embodiment of the method, the light-emitting diode structure is detached from the layer sequence after its application. The light-emitting diode structure can then be used, for example, in the form of a substrateless diode. Furthermore, it is possible for the light-emitting diode structure to be applied to a carrier by its side remote from the layer sequence, prior to detachment. The carrier can, for example, contain silicon or germanium or consist of one of the materials.

BRIEF DESCRIPTION OF THE DRAWINGS

The method described here is explained in greater detail below on the basis of exemplary embodiments and the associated figures.

Elements that are identical, of identical type or act identically are provided with the same reference symbols in the figures. The figures and the size relationships of the elements illustrated in the figures among one another should not be regarded as to scale. Rather, individual elements may be illustrated with an exaggerated size in order to enable better illustration and/or in order to afford better understanding.

DETAILED DESCRIPTION OF ILLUSTRATIVE EMBODIMENTS

Figure 1:
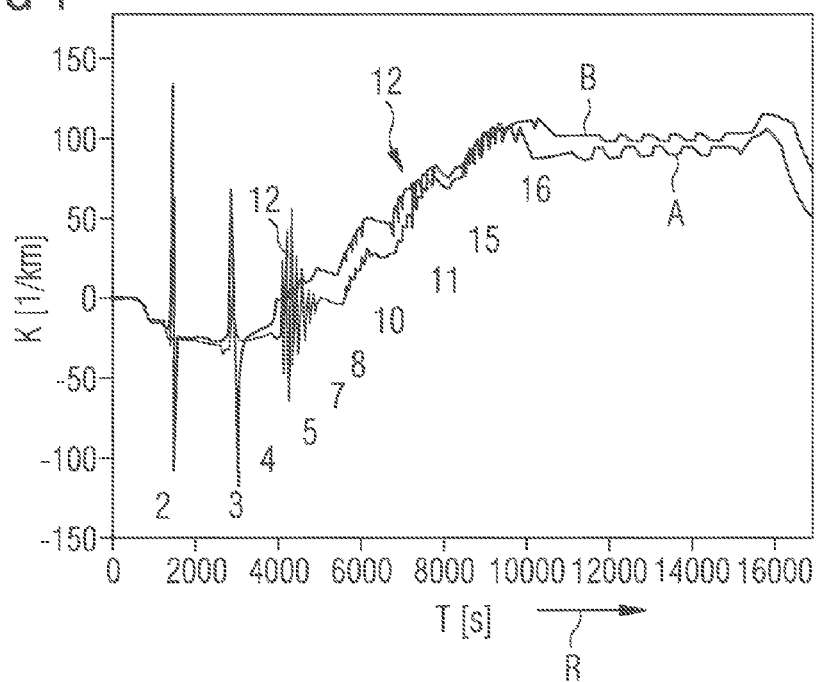
FIGS. 1 and 6 show graphical plots on the basis of which the method described here is elucidated in greater detail.

FIG. 1 shows a graphical plot of the curvature K of the layers deposited onto the silicon surface of the layer sequence and also of the light-emitting diode structure against the growth time T in seconds. In this case, the growth direction R corresponds to the temporal profile. FIG. 1 illustrates two curves. Curve A relates to an exemplary embodiment in which a masking layer formed with silicon nitride is grown before the first GaN layer of the layer sequence 100.

Figure 2:
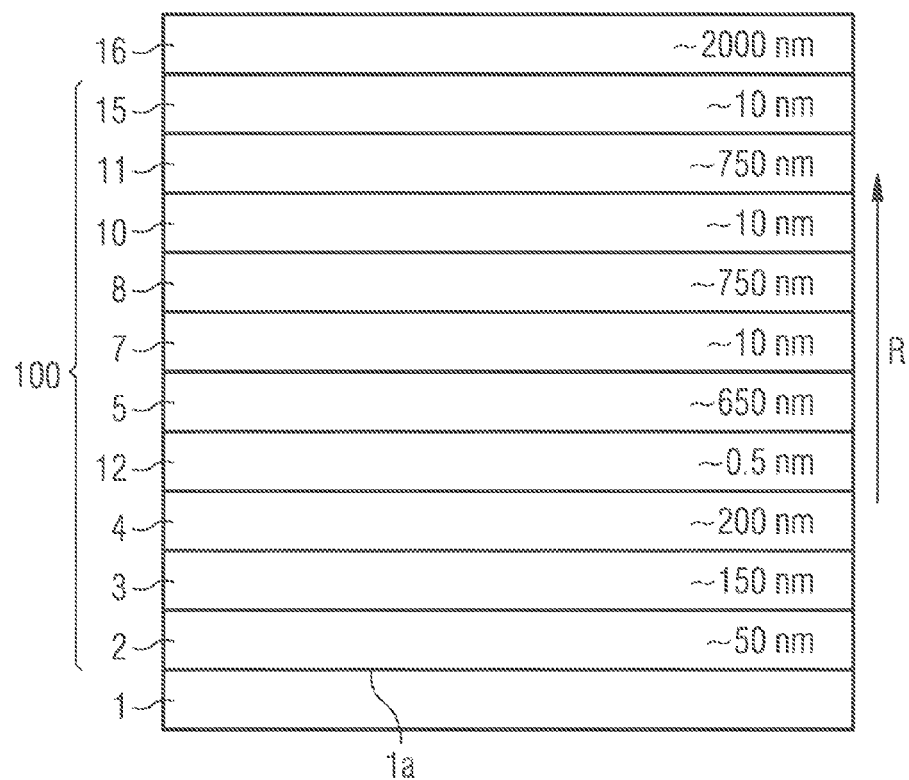
FIGS. 2, 3, 4 and 5 show schematic sectional illustrations of epitaxially produced layer structures on the basis of which the method described here is elucidated in greater detail.

The schematic sectional illustration in FIG. 2 shows one such layer profile. The carrier substrate 1 with its silicon surface 1a is succeeded by the masking layer 12, which is succeeded by the first GaN layer 5 of the layer stack 100 in the growth direction R. The layer stack 100 comprises with the GaN layers 5, 8 and 11 a total of three GaN layers.

Curve B relates to an exemplary embodiment in which the masking layer is arranged in the third GaN layer 11 of the layer stack 100. This is elucidated graphically on the basis of a schematic sectional illustration, for example, in FIG. 3.

As is evident from FIG. 1, the curvature in case B is greater than for case A particularly in the region of the light-emitting diode structure 16. Temporally later introduction of the masking layer 12 into the layer sequence 100 therefore leads to a greater compressive strain of the grown layers.

The sequence of the layers is here, for example, for case B as follows (see the schematic sectional illustration in FIG. 3).

The layer structure 100 comprises a carrier substrate 1, which consists of silicon, for example, and has a silicon surface, for example, a (111) surface 1a.

The following layers of the layer sequence 100 are deposited onto the silicon surface one on top of another in the growth direction R, for example directly:

- a nucleation layer 2 composed of aluminum nitride,
- a buffer layer 3 composed of aluminum nitride, which is deposited at higher growth temperatures, for example, at least 1000° C., than the nucleation layer 2,
- an AlGaN layer 4, in which the aluminum concentration decreases in a gradated manner from at most 95% to at least 15% in the growth direction R,
- a first GaN layer 5,
- an AlN layer or AlGaN layer 7, which can be grown at lower growth temperatures of approximately 850° C.,
- a second GaN layer 8,
- a subsequent AlN layer or AlGaN layer 10, which can in turn be grown at approximately 850° C.,
- a third GaN layer 11, within which the masking layer 12 is arranged, and
- an AlN layer or AlGaN layer 15.

The light-emitting diode structure 16 is arranged at that side of the AlN layer or AlGaN layer 15 which is remote from the carrier substrate 1, the light-emitting diode structure comprising, for example, multiple quantum well structures and being based on GaN.

The layer structure corresponding to curve A is illustrated in FIG. 2.

Figure 4:
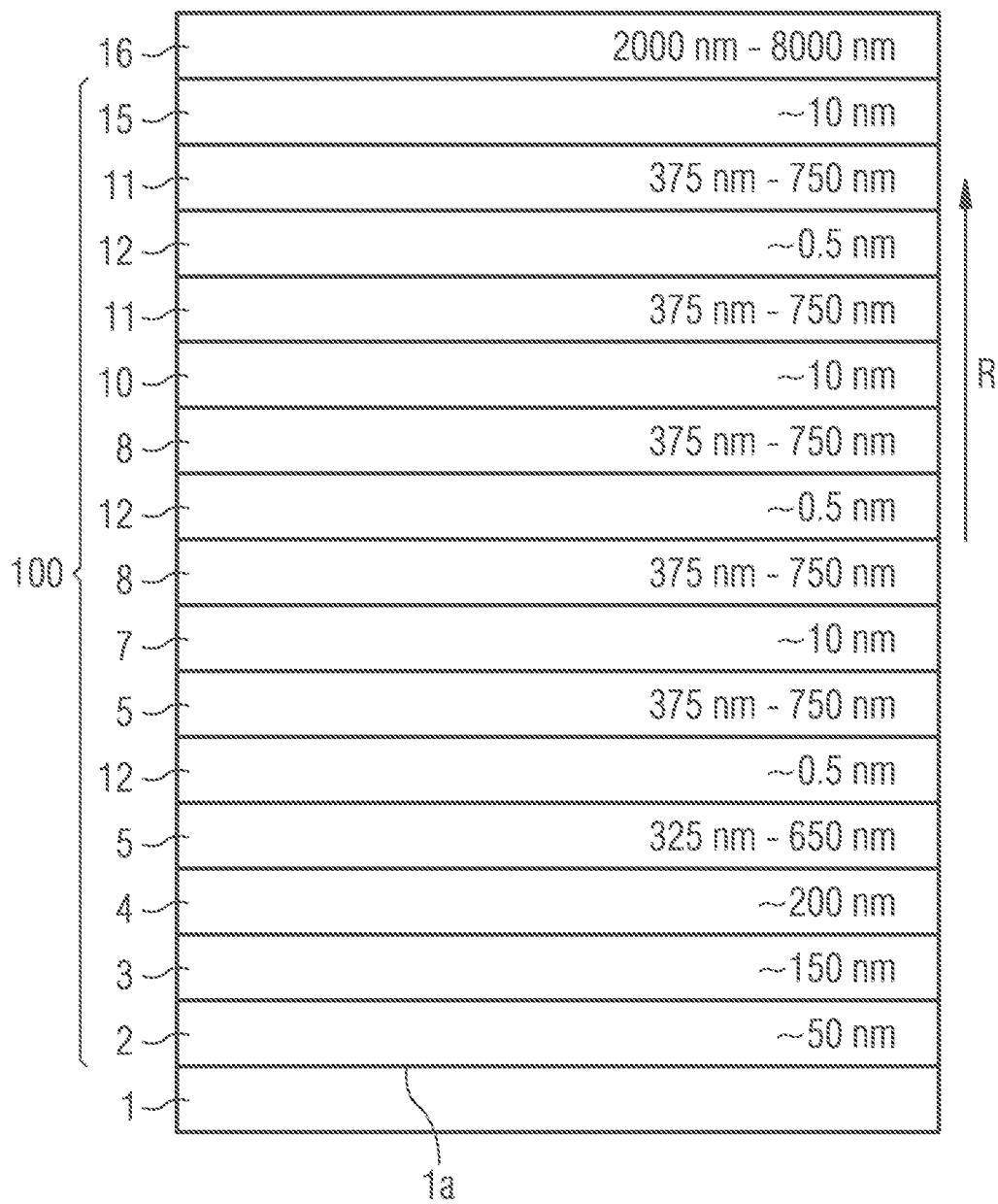

A further exemplary embodiment of a method described here is explained in greater detail in conjunction with FIG. 4. The sequence of layers illustrated schematically in the sectional illustration in FIG. 4 is produced by means of the method.

Figure 3:
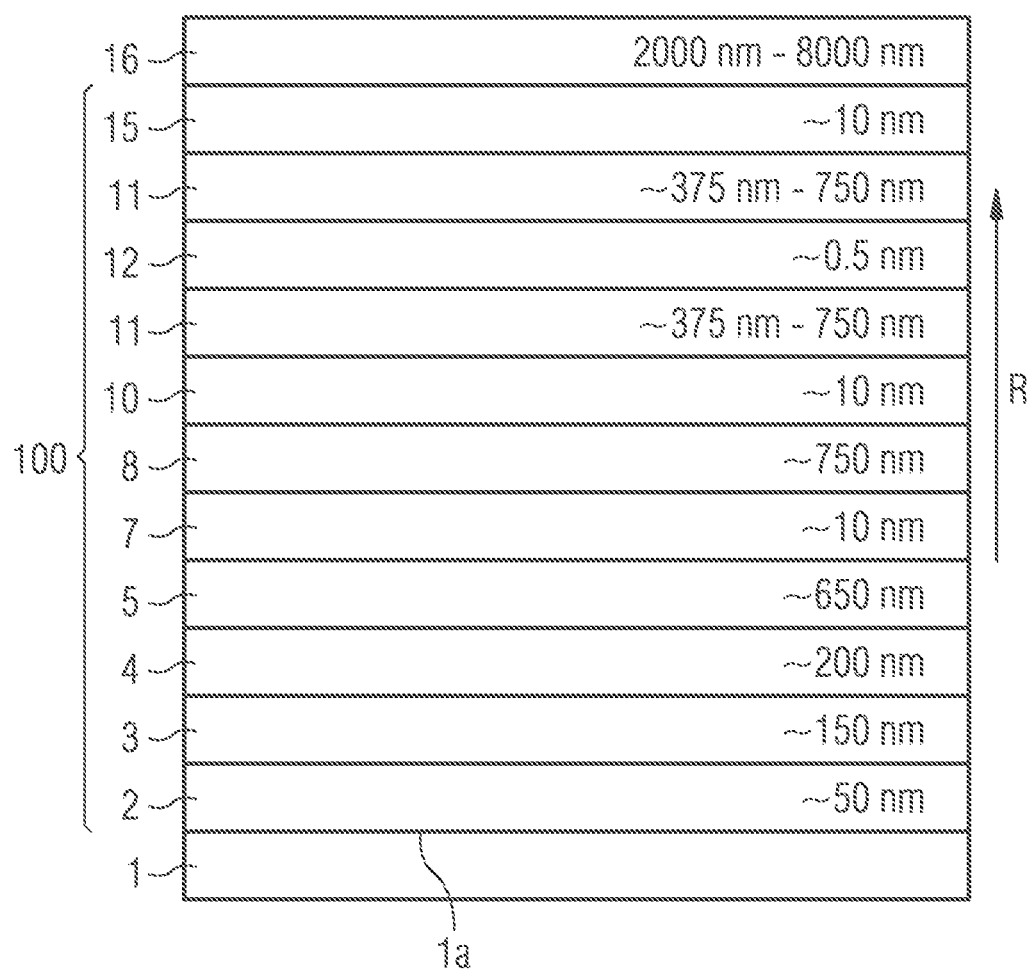

In contrast to the sequence of layers as described in conjunction with FIG. 3, the layer sequence 100 in this exemplary embodiment comprises a masking layer 12 between each GaN layer 5, 8, 11, the masking layer 12 being formed with silicon nitride and, for example, consisting of silicon nitride. In this case, the masking layers 12 can have in each case a thickness of at least 0.35 nm and at most 0.65 nm as measured in the growth direction R.

The introduction of a masking layer 12 into each GaN layer of the layer sequence 100 leads, at that surface of the layer sequence 100 which is remote from the carrier substrate 1, to the build-up of a particularly high compressive strain, which allows a light-emitting diode structure 16 to be grown which has a thickness of up to 8 μm as measured in the growth direction R, without cracks occurring in the light-emitting diode structure 16.

Figure 5:
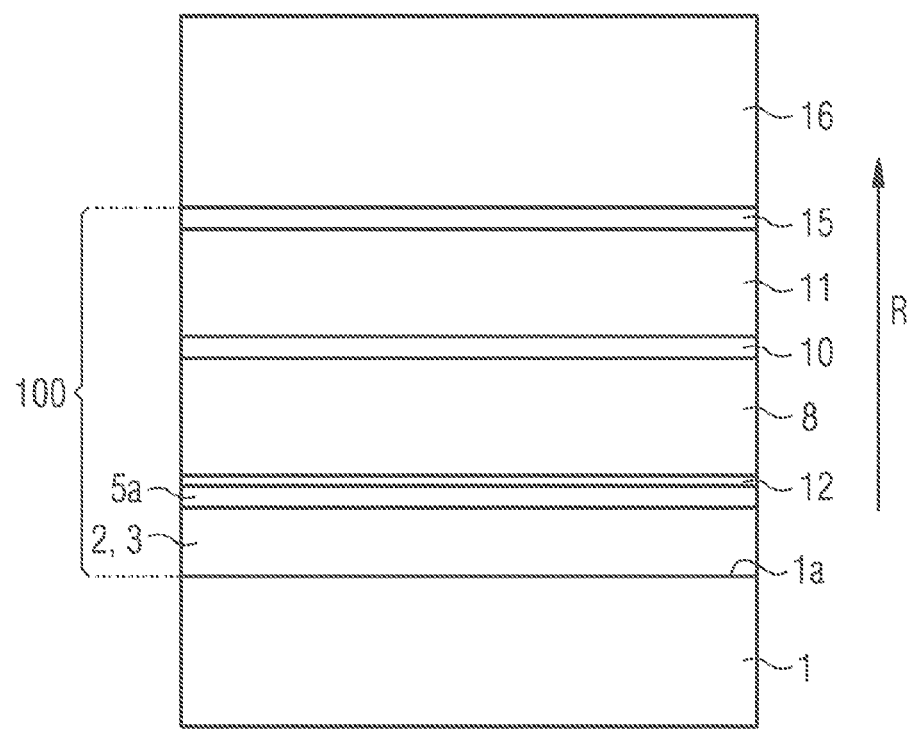

A further exemplary embodiment of a method described here is explained in greater detail in conjunction with FIG. 5. In contrast to the exemplary embodiment in FIG. 2, for example, the layer sequence 100 in the present case is free of an AlGaN transition layer. The layer construction of the layer sequence 100 in the growth direction can be as follows, for example:

- a substrate 1 having a silicon surface 1a,
- a nucleation layer 2 and a buffer layer 3, which can in each case consist of aluminum nitride, for example, and have a thickness together of approximately 200 nm,
- a GaN layer 5a, which is grown in pseudomorphic fashion and has a thickness of approximately 100 nm,
- a first masking layer 12, which is formed with silicon nitride, for example, and has a thickness of between 1 nm and 2 nm,
- a further GaN layer 8, which has a thickness of approximately 700 nm,
- a first AlN layer 10, which can be grown for example at a temperature of approximately 850° C.,
- a third GaN layer 11, which has a thickness of approximately 700 nm, for example, and
- a further AlN layer 15, which can be grown at low growth temperatures of approximately 850° C.

This layer sequence 100 is succeeded by the light-emitting diode structure 16, having a thickness of between 4 μm and 8 μm, for example.

The exemplary embodiment in FIG. 5 is distinguished, in particular, by the fact than an AlGaN transition layer between the buffer layer 3 and the first masking layer 12 is dispensed with.

Figure 6:
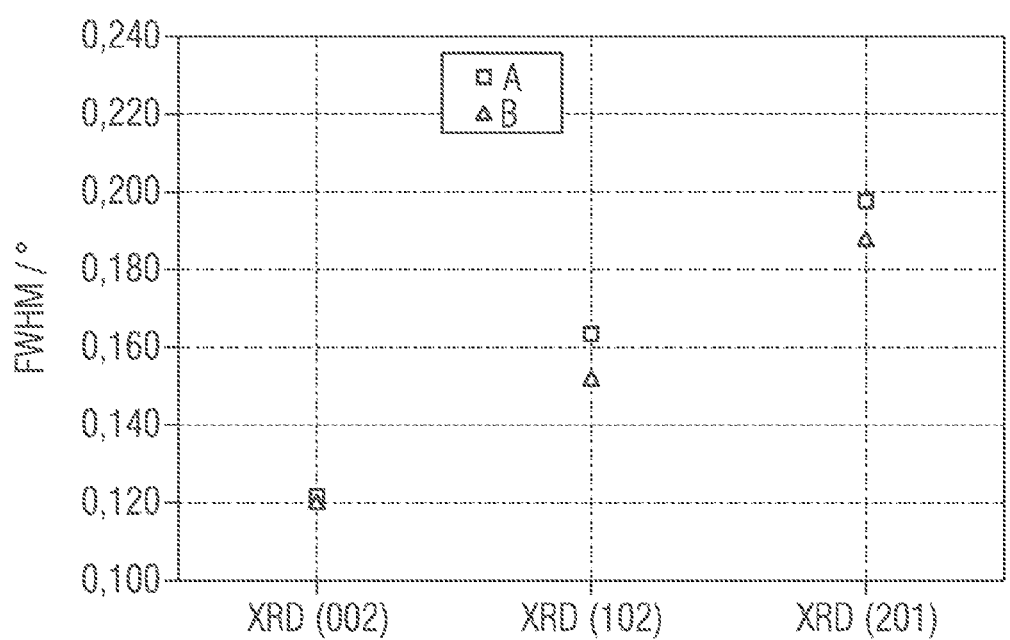

The effect of dispensing with the AlGaN transition layer 4 is illustrated graphically in conjunction with FIG. 6. In this respect, FIG. 6 shows the full width at half maximum values of the x-ray rocking curves for different reflections.

The values A in FIG. 6 relate to a reference structure, as shown in FIG. 2, for example, which contains an AlGaN layer 4. The values B relate to a layer sequence 100, as illustrated in FIG. 5, in which the transition layer AlGaN is dispensed with.

In particular, FIG. 6 shows lower values for the full width at half maximum values of the x-ray rocking curves for the reflections 102 and 201. This is a clear indication of a reduced defect density of edge dislocations. This allows the expectation of a higher internal quantum efficiency in an active layer of the light-emitting diode structure 16, the active layer being designed for generating radiation. In addition, such a layer sequence 100 can be produced significantly more simply and thus more cost-effectively.

In FIGS. 2, 3 and 4 and also in the description concerning FIG. 5, exemplary thicknesses or thickness ranges are indicated for each layer. In this case, the thicknesses or the indicated limits for the ranges of thicknesses can fluctuate in ranges of +/−30%, preferably +/−20%, particularly preferably +/−10%, around the indicated values.

The invention is not restricted to the exemplary embodiments by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

What is claimed is:

1. A method for producing a layer structure, the method comprising:
   providing a carrier substrate having a silicon surface; and
   depositing a layer sequence on the silicon surface in a growth direction;
   wherein the layer sequence contains a GaN layer formed with gallium nitride,
   wherein the layer sequence contains a first masking layer formed with silicon nitride,
   wherein the first masking layer succeeds at least part of the GaN layer in the growth direction, and
   wherein the first masking layer is deposited after depositing any GaN layer in the layer sequence and the layer sequence is free of any masking layer in between the GaN layer and the silicon surface.

2. The method according to claim 1, wherein the first masking layer is arranged within the GaN layer.

3. The method according to claim 1, wherein the first masking layer directly adjoins two GaN layers.

4. The method according to claim 1, wherein at least two GaN layers are arranged before the first masking layer in the growth direction.

5. The method according to claim 1, wherein the layer sequence contains at least two GaN layers, and each GaN layer is succeeded by an AlN layer in the growth direction.

6. The method according to claim 1, wherein the layer sequence contains at least two GaN layers, and each GaN layer is succeeded by an AlGaN layer in the growth direction.

7. The method according to claim 1, wherein the layer sequence contains at least two GaN layers, and each GaN layer is succeeded by an AlGaN layer and/or an AlN layer in the growth direction.

8. The method according to claim 7, wherein a Ga concentration in at least one of the AlGaN layers is at least 5% and at most 10%.

9. The method according to claim 1, wherein the layer sequence contains at least two GaN layers, and a masking layer is arranged within each GaN layer.

10. The method according to claim 1, wherein the layer sequence between the silicon surface and the first masking layer in the growth direction is free of an AlGaN layer.

11. The method according to claim 1, wherein the layer sequence is free of an AlGaN layer.

12. The method according to claim 1, further comprising forming a buffer layer over the carrier substrate, wherein a GaN layer directly succeeds the buffer layer in the growth direction.

13. The method according to claim 12, wherein the GaN layer that directly succeeds the buffer layer in the growth direction is a pseudomorphic GaN layer.

14. The method according to claim 13, wherein the first masking layer in the growth direction is arranged between the pseudomorphic GaN layer and a further GaN layer, wherein the first masking layer has a thickness between 0.5 nm and 2.5 nm.

15. The method according to claim 1, further comprising depositing an active structure onto the layer sequence.

16. The method according to claim 15, wherein the active structure is detached from the layer sequence.

17. The method according to claim 1, wherein the first masking layer is grown after depositing the GaN layer.

18. The method according to claim 1, wherein forming the layer sequence comprises:
depositing a nucleation layer composed of aluminum nitride directly onto the silicon surface, and
depositing a buffer layer composed of aluminum nitride directly onto the nucleation layer, the buffer layer deposited at a higher growth temperature than the nucleation layer; and
depositing a pseudomorphic GaN layer directly onto the buffer layer.

19. A method for producing a layer structure, the method comprising:
providing a carrier substrate having a silicon surface; and
depositing a layer sequence on the silicon surface in a growth direction;
wherein the layer sequence contains a GaN layer formed with gallium nitride;
wherein the layer sequence contains a first masking layer formed with silicon nitride;
wherein the first masking layer succeeds at least part of the GaN layer in the growth direction;
wherein the first masking layer is grown after depositing the GaN layer;
wherein the GaN layer directly succeeds a buffer layer in the growth direction; and
wherein the GaN layer is a pseudomorphic GaN layer.

20. The method according to claim 19, wherein depositing the layer sequence comprises:
depositing a nucleation layer composed of aluminum nitride directly onto the silicon surface, and
depositing a buffer layer composed of aluminum nitride directly onto the nucleation layer, the buffer layer deposited at a higher growth temperature than the nucleation layer; and
depositing the pseudomorphic GaN layer directly onto the buffer layer.

21. A method for producing a layer structure, the method comprising:
providing a carrier substrate having a silicon surface; and
depositing a layer sequence on the silicon surface in a growth direction;
wherein the layer sequence contains a GaN layer formed with gallium nitride;
wherein the layer sequence contains a first masking layer formed with silicon nitride;
wherein the first masking layer succeeds at least part of the GaN layer in the growth direction; and
wherein forming the layer sequence comprises:
directly depositing a nucleation layer composed of aluminum nitride onto the silicon surface, and directly depositing a buffer layer composed of aluminum nitride onto the nucleation layer, the buffer layer deposited at a higher growth temperature than the nucleation layer; and
directly depositing a pseudomorphic GaN layer onto the buffer layer.

* * * * *